(12) United States Patent
Hu et al.

(10) Patent No.: US 12,261,040 B2
(45) Date of Patent: Mar. 25, 2025

(54) SUBSTRATE STRIPPING METHOD AND EPITAXIAL WAFER

(71) Applicant: HC SEMITEK (ZHEJIANG) CO., LTD., Zhejiang (CN)

(72) Inventors: Hongpo Hu, Zhejiang (CN); Binzhong Dong, Jiangsu (CN); Peng Li, Jiangsu (CN); Jiangbo Wang, Jiangsu (CN)

(73) Assignee: HC Semitek (Zhejiang) Co. Ltd., Zhejiang (CN)

( * ) Notice: Subject to any disclaimer, the term of this patent is extended or adjusted under 35 U.S.C. 154(b) by 0 days.

(21) Appl. No.: 17/773,293

(22) PCT Filed: Oct. 30, 2020

(86) PCT No.: PCT/CN2020/125103
§ 371 (c)(1),
(2) Date: Apr. 29, 2022

(87) PCT Pub. No.: WO2021/083304
PCT Pub. Date: May 6, 2021

(65) Prior Publication Data
US 2024/0153761 A1 May 9, 2024

(30) Foreign Application Priority Data
Oct. 30, 2019 (CN) .......................... 201911042035.0

(51) Int. Cl.
*H01L 21/00* (2006.01)
*H01L 21/02* (2006.01)

(52) U.S. Cl.
CPC .. *H01L 21/02293* (2013.01); *H01L 21/02348* (2013.01); *H01L 21/02458* (2013.01); *H01L 21/02483* (2013.01); *H01L 21/0254* (2013.01)

(58) Field of Classification Search
CPC ......... H01L 21/02293; H01L 21/02348; H01L 21/02458; H01L 21/0254
See application file for complete search history.

(56) References Cited

U.S. PATENT DOCUMENTS

2008/0217645 A1* 9/2008 Saxler ............... H01L 21/02658
257/101
2014/0087541 A1* 3/2014 Werner ................. H01L 21/304
438/478

(Continued)

FOREIGN PATENT DOCUMENTS

CN 101432850 A 5/2009
CN 108878598 A 11/2009

(Continued)

OTHER PUBLICATIONS

"Close." Merriam-Webster.com. 2024. https://www.merriam-webster.com/dictionary/close#dictionary-entry-2 (May 30, 2024). (Year: 2024).*

(Continued)

*Primary Examiner* — Reema Patel
(74) *Attorney, Agent, or Firm* — Morgan, Lewis & Bockius LLP (57) ABSTRACT

A substrate stripping method and an epitaxial wafer, relating to the technical field of semiconductors. The method comprises: providing a substrate (1), the substrate (1) having a recess, and the recess being distributed on a first surface (1a) of the substrate (1); forming a hydrophilic layer (3) in the recess; forming, on the first surface (1a), an etching sacrificial layer (4) covering the first surface (1a), the etching sacrificial layer (4) and the recess defining a flowing space (A); growing an epitaxial layer (5) on the etching sacrificial layer (4); and soaking the etching sacrificial layer (4) and the substrate (1) in an etching liquid, and corroding the etching sacrificial layer (4) by means of the etching liquid until the (Continued)

epitaxial layer (5) is separated from the substrate (1). The method can rapidly and uniformly etch the etching sacrificial layer (4).

20 Claims, 4 Drawing Sheets

(56) References Cited

U.S. PATENT DOCUMENTS

2015/0069418 A1\* 3/2015 Heo .................... H01L 33/0075
 257/79
2018/0047627 A1 2/2018 Forrest et al.

FOREIGN PATENT DOCUMENTS

| CN | 104221170 A | 12/2014 | |
|---|---|---|---|
| CN | 106688113 A | 5/2017 | |
| CN | 111081531 A | 4/2020 | |
| WO | WO-2007001141 A1 \* | 1/2007 | ......... H01L 21/0237 |

OTHER PUBLICATIONS

HC Semitek (Zhejiang) Co Ltd, International Search Report and Written Opinion, PCTCN2020/125103, Feb. 1, 2021, 14 pgs.
HC Semitek (Zhejiang) Co Ltd, International Preliminary Report on Patentability, PCTCN2020/125103, May 3, 2022, 5 pgs.

\* cited by examiner

SUBSTRATE STRIPPING METHOD AND EPITAXIAL WAFER

This application is a United States National Stage Application filed under 35 U.S.C. § 371 of PCT Patent Application Serial No. PCT/CN2020/125103, filed on Oct. 30, 2020, which claims the priority to and the benefit of Chinese Patent Application No. 201911042035.0, titled "An Epitaxial Layer Stripping Method", filed on Oct. 30, 2019, the entire contents of which are incorporated herein by reference.

TECHNICAL FIELD

The preset disclosure relates to the filed of semiconductor technology, and in particular, to a substrate stripping method and an epitaxial wafer.

BACKGROUND

Semiconductor devices can be used to generate, control, receive, transform, amplify signals and perform energy conversion, and are widely used. In the manufacturing process of some semiconductor devices, it is necessary to first grow an epitaxial layer on a substrate, then separate the epitaxial layer from the substrate, and finally perform subsequent processing on the epitaxial layer to obtain a semiconductor device.

SUMMARY

The embodiments of the present disclosure provide a substrate stripping method and an epitaxial wafer, which can peel off an epitaxial layer from a substrate quickly and completely.

A substrate stripping method is provided by the embodiments of the disclosure, the method including:
  providing a substrate, the substrate having a recess, the recess is distributed on a first surface of the substrate;
  forming a hydrophilic layer in the recess;
  forming, on the first surface, an etching sacrificial layer covering the first surface, the etching sacrificial layer and the recesses defining a flowing space;
  growing an epitaxial layer on the etching sacrificial layer; and
  soaking the etching sacrificial layer and the substrate in an etching liquid, and corroding the etching sacrificial layer by means of the etching liquid until the epitaxial layer is separated from the substrate.

Optionally, forming a hydrophilic layer in the recess includes:
  forming a $TiO_2$ film in the recess;
  irradiating the $TiO_2$ film with ultraviolet light to obtain the hydrophilic layer.

Optionally, the substrate is transparent,
  wherein irradiating the $TiO_2$ film with ultraviolet light, includes
  irradiating the $TiO_2$ film with ultraviolet light from a second surface of the substrate, the second surface and the first surface are two opposite surfaces of the substrate.

Optionally, the $TiO_2$ film is formed before growing the epitaxial layer, and the irradiation of the $TiO_2$ film with ultraviolet light is performed after growing the epitaxial layer.

Optionally, the $TiO_2$ film is doped with N (nitrogen), C (carbon) or F (fluorine) element for improving the hydrophilicity of the $TiO_2$ film.

Optionally, the method further includes:
  fixing a support substrate onto a surface of the epitaxial layer which is away from the substrate before irradiating the $TiO_2$ film with ultraviolet light.

Optionally, forming the etching sacrificial layer on the hydrophilic layer includes:
  forming a plurality of nucleation islands in regions of the first surface other than the recess;
  growing the etching sacrificial layer laterally with each of the nucleation islands as growth points.

Optionally, the etching sacrificial layer is made of nitride material, wherein growing the etching sacrificial layer laterally with each of the nucleation islands as growth points includes:
  under the condition that the temperature is 960° C.~1010° C. and the V/III 800~1200, growing etching sacrificial layer thin films in a three-dimensional growth mode for 600~1500 s;
  under the condition that the temperature is 1040~1070° C. and the V/III is adjusted to 1500~3000, growing the etching sacrificial layer films in a two-dimensional growth mode, in which the etching sacrificial layer films will grow laterally, until the etching sacrificial layer thin films grown on each of the nucleation islands are laterally connected to form the etching sacrificial layer.

Optionally, the nucleation islands are AlN nucleation islands, and the etching sacrificial layer is a GaN layer.

Optionally, the method further includes: growing an etch stop layer on the etch sacrificial layer before growing the epitaxial layer on the etch sacrificial layer.

Optionally, the etch stop layer is doped with magnesium element which is used to change the polarity of the side of the etch stop layer close to the substrate.

Optionally, the method further includes: bombarding the etch stop layer with plasma to remove the etch stop layer after the epitaxial layer is separated from the substrate.

Optionally, the thickness of the $TiO_2$ film is 50-300 nanometers, and the depth of the recess is 2-5 micrometers.

Optionally, the recess defines a plurality of bosses on the first surface; or, the recess defines a plurality of strip-shaped protrusions that are parallel to each other on the first surface.

Optionally, the etching liquid is KOH etching liquid or NaOH etching liquid.

An epitaxial wafer is provided by the embodiments of the disclosure, including:
  a substrate, the substrate having a recess, and the recess being distributed on a first surface of the substrate;
  a hydrophilic layer in the recess;
  an etch sacrificial layer covering the first surface and defining a flow space with the recesses;
  an epitaxial layer on the etch sacrificial layer.

Optionally, the hydrophilic layer is a $TiO_2$ film.

Optionally, the $TiO_2$ film is doped with N (nitrogen), C (carbon) or F (fluorine) element.

Optionally, the epitaxial wafer further includes a plurality of nucleation islands sandwiched between the etch sacrificial layer and the first surface.

Optionally, the epitaxial wafer further includes an etch stop layer between the etch sacrificial layer and the epitaxial layer.

The beneficial effects brought by the technical solutions provided by the embodiments of the present disclosure includes:
  by forming a hydrophilic layer in the recess of the first surface, and then forming an etching sacrificial layer on the first surface to cover the first surface, and the etching sacrificial layer and the recess define a flowing space such that when the etching sacrificial layer and the substrate are soaked in the etching liquid after the epitaxial layer is grown, the hydrophilic layer can guide the etching liquid to flow rapidly in the flowing space such that the etching liquid can corrode the etching sacrificial layer rapidly and uniformly until the epitaxial layer is separated from the first surface of the substrate.

BRIEF DESCRIPTION OF THE DRAWINGS

In order to illustrate the technical solutions in the embodiments of the present disclosure more clearly, the following briefly introduces the accompanying drawings used in the description of the embodiments. Obviously, the accompanying drawings in the following description are only some embodiments of the present disclosure. For those of ordinary skill in the art, other drawings can also be obtained from these drawings without creative effort.

DETAILED DESCRIPTION

In order to make the objectives, technical solutions and advantages of the present disclosure clearer, the embodiments of the present disclosure will be further described in detail below with reference to the accompanying drawings.

In the related art, the epitaxial layer is usually separated from the substrate in the following manner: before growing the epitaxial layer, form an etching sacrificial layer on the substrate. After the epitaxial layer is grown, the substrate and the etching sacrificial layer are soaked in an etching liquid, and the etching sacrificial layer is etched by the etching liquid until the epitaxial layer is separated from the substrate. However, the stripping process of this stripping method is slow, and part of the epitaxial layer is easy to be etched, which affects the quality of the semiconductor device. In addition, in the process of etching the sacrificial layer from the edge to the middle of the epitaxial wafer, the edge portion may be over-etched, resulting in poor etching uniformity.

Figure 1:
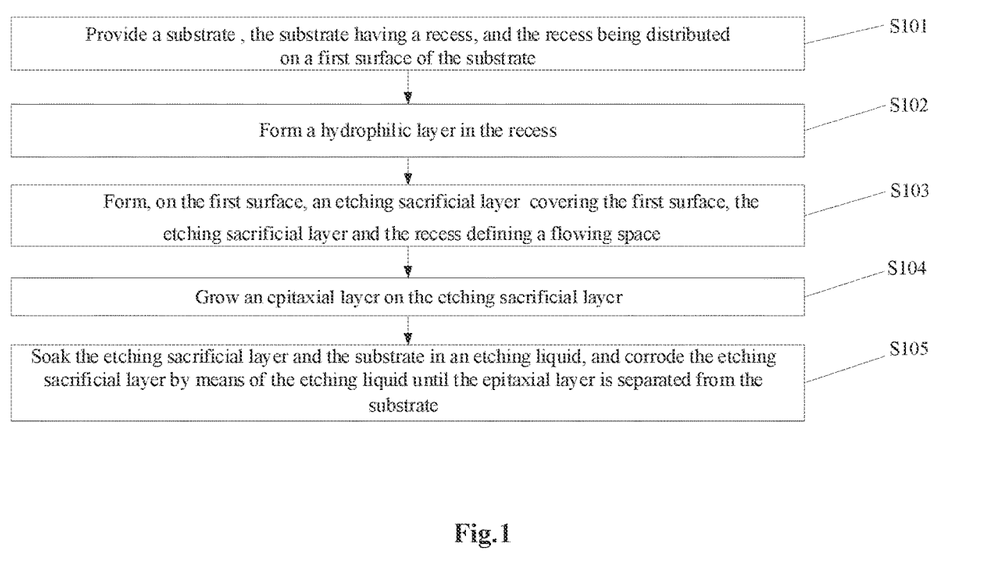
FIG. 1 is a flowchart of a substrate stripping method provided by an embodiment of the present disclosure.

FIG. 1 is a flowchart of a substrate peeling method provided by an embodiment of the present disclosure. As shown in FIG. 1, the substrate peeling method includes:

In step S101, provide a substrate having a recess which is distributed on the first surface of the substrate.

In step S102, form a hydrophilic layer in the recesses.

In step S103, form, on the first surface, an etching sacrificial layer covering the first surface, the etching sacrificial layer and the recesses defining a flowing space.

In step S104, grow an epitaxial layer on the etching sacrificial layer.

In step S105, soak the etching sacrificial layer and the substrate in an etching liquid, and corrode the etching sacrificial layer by means of the etching liquid until the epitaxial layer is separated from the substrate.

According to the embodiments of the present disclosure, a hydrophilic layer is formed in the recess of the first surface, and then an etching sacrificial layer is formed on the first surface to cover the first surface, and the etching sacrificial layer and the recess define a flowing space. When the etching sacrificial layer and the substrate are soaked in the etching liquid, the hydrophilic layer can guide the etching liquid to flow rapidly in the flowing space such that the etching liquid can corrode the etching sacrificial layer rapidly and uniformly until the epitaxial layer is separated from the first surface of the substrate.

Figure 2:
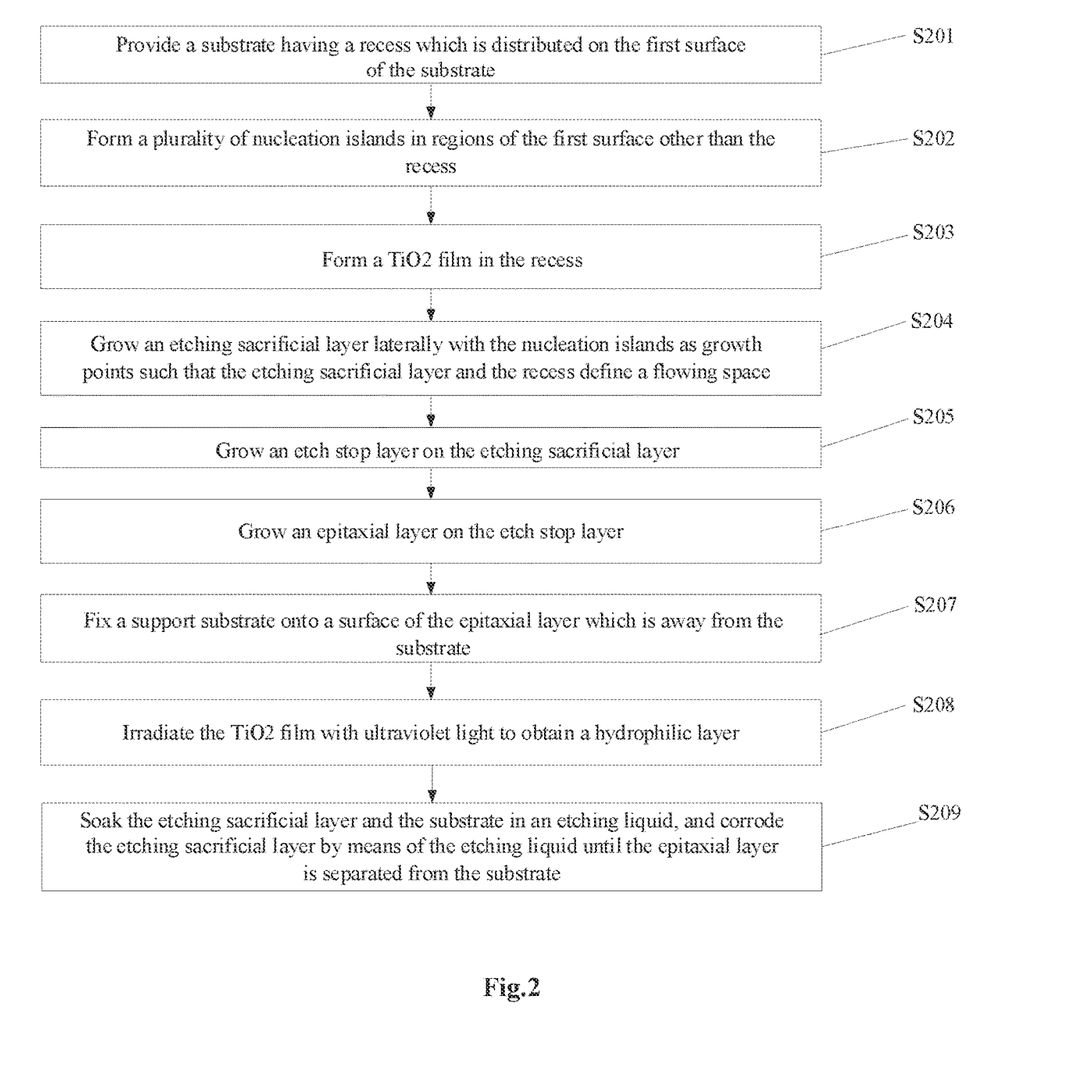
FIG. 2 is a flowchart of another substrate stripping method provided by an embodiment of the present disclosure.

FIG. 2 is a flowchart of a substrate stripping method provided by an embodiment of the present disclosure. As shown in FIG. 2, the method includes: In step S201, provide a substrate having a recess which is distributed on the first surface of the substrate.

The substrate in step S201 may be fabricated by a photolithography process, which will not be described in detail in the present disclosure.

In a possible implementation manner, the recess defines a plurality of bosses on the first surface.

Optionally, the boss can be a frustum of a cone or a cylindrical structure. In this case, the recess is grid-like.

The side walls of the frustum of a cone or the cylindrical structure are arc-shaped, which can allow the etching liquid to flow relatively smoothly in the flowing space. Optionally, the frustums of a cone or the cylindrical structures are arranged on the substrate at equal intervals, for example, in an array arrangement, so that the etching sacrificial layer grown on the end faces of the bosses is easier to be etched and separated.

Optionally, a height of the boss may be 2-5 microns.

Optionally, the maximum diameter of the boss (ie the diameter of the bottom surface) may be 1-5 micrometers, and the diameter of the end surface of the boss (ie the diameter of the top surface) may be 1-5 micrometers. The maximum diameter of the boss and the diameter of the end face can be set according to actual needs, as long as the diameter of the end face of the boss is smaller than the maximum diameter of the boss.

Optionally, the maximum diameter of the boss is 2-5 microns, and the diameter of the end face of the boss is 1-3 microns. When the maximum diameter of the boss is 2~5 microns, and the diameter of the end face of the boss is 1~3 microns, the slope of the boss is more appropriate, which can ensure the smooth flow of the etching liquid between the bosses, and has lower requirements for the manufacturing process in order to reduce the cost.

Exemplarily, on the premise that the maximum diameter of the boss is 2-5 microns and the diameter of the end face of the boss is 1-3 microns, the vertical distance between the axes of adjacent bosses may be 2-10 microns, for example 3~7 microns.

When the diameter of the end face of the boss is 1-3 microns, while the maximum diameter of the boss is 2~5 microns, and the vertical distance between the axes of the adjacent bosses is 3~7 microns, the etching sacrificial layer can grow on the first surface to form a relatively stable structure and the surface flatness of the etching sacrificial layer is high.

It should be noted that, in the embodiments of the present disclosure, the end surfaces of the bosses are the first surfaces of the substrate, and the bottom surfaces of the bosses are the surfaces of the bosses away from the first surface. The height of the boss is the dimension of the boss in a direction perpendicular to the first surface.

In another possible implementation manner, the recess defines a plurality of strip-shaped protrusions that are parallel to each other on the first surface on the first surface. In this case, the first surface has a plurality of parallel grooves.

In Step S202, form a plurality of nucleation islands in regions of the first surface other than the recess.

Optionally, the nucleation islands can be made of materials such as AlN, AlGaN, GaN, and the like.

Optionally, the step S202 includes:
forming a nucleation layer covering the first surface; and
removing the nucleation layer in the recess to obtain the nucleation islands.

Exemplarily, the nucleation layer can be deposited on the first surface by chemical vapor deposition or the like, and the nucleation layer in the recess can be removed by a photolithography process.

In step S203, form a TiO2 film in the recess.

Optionally, the step S203 includes: forming a photoresist mask on the nucleation islands; forming a TiO2 layer on the first surface which covers the first surface (that is, covers the nucleation islands and the bottom surface and sidewalls of the recess); removing the photoresist mask and the TiO2 layer on the photoresist mask with a degumming solution to obtain a thin film located in the recess.

Alternatively, the TiO2 layer may be formed on the first surface by DC magnetron sputtering, chemical vapor deposition or sol-gel method.

In the embodiment of the present disclosure, the thickness of the TiO2 film is smaller than the depth of the recess.

In a possible implementation manner, the TiO2 film covers the bottom surface and sidewalls of the recess.

In another implementation manner, the TiO2 film covers the bottom surface of the recess.

Optionally, the TiO2 film may be doped with elements for improving the hydrophilicity of the TiO2 film, and the elements for improving the hydrophilicity of the TiO2 film include but are not limited to N, C or F elements.

The crystallinity and density of the TiO2 film are improved by doping, and the absorption of ultraviolet light is enhanced, so that the TiO2 film is super-hydrophilic. The super-hydrophilicity of the TiO2 film can further improve the fluidity of the etching liquid in the flowing space, thereby improving the etching efficiency and etching uniformity of the etching sacrificial layer.

Optionally, the thickness of the TiO2 film covering the first surface may be 50-300 nanometers. When the thickness of the TiO2 film covering the first surface is 50-300 nanometers, and the depth of the recess is 2-5 micrometers, it can ensure that there is enough flowing space between the etching sacrificial layer and the TiO2 film to ensure the etching effect of the etching liquid. It should be noted that, in this embodiment, the nucleation islands are formed before the TiO2 film is formed in the recess. In other embodiments, the TiO2 film may be formed in the recess before the nucleation islands are formed on the first surface.

In step S204, grow an etching sacrificial layer laterally with the nucleation islands as growth points such that the etching sacrificial layer and the recess define a flowing space.

In the embodiments of the present disclosure, the etching sacrificial layer is made of nitride materials, such as a GaN layer and so on.

Optionally, the step S204 may include:
under the condition that the temperature is 960° C.~1010° C. and the V/III 800~1200, grow etching sacrificial layer thin films in a three-dimensional growth mode for 600~1500 s;
under the condition that the temperature is 1040~1070° C. and the V/III is adjusted to 1500~3000, grow the etching sacrificial layer films in a two-dimensional growth mode, in which the etching sacrificial layer films will grow laterally, until the etching sacrificial layer thin films grown on each of the nucleation islands are laterally connected to form the etching sacrificial layer.

It should be noted that growing the etching sacrificial layer films in the three-dimensional growth mode can be understood as: under the conditions that the temperature is 960° C.~1010° C. and the V/III is 800~1200, the etching sacrificial layer films tend to be agglomerated and grown on the nucleation layer in the normal direction of the first surface. The image forces generated by the inclined plane formed during the three-dimensional growth mode of the etching sacrificial layer films bend the dislocation defects in the etching sacrificial layer films, reduce the upward extension of dislocation defects, and improve the crystal quality of the finally grown etching sacrificial layer. After the sacrificial layer films are grown in the three-dimensional growth mode for 600 to 1500 s, the quality of the sacrificial etching layer films formed on the bosses is good and there is space for the sacrificial layer films to grow laterally.

Optionally, under the condition that the temperature is 1040-1070° C. and the V/III is adjusted to 1500~3000, growing the etching sacrificial layer films in the two-dimensional growth mode, includes:
under the condition that the temperature is 1040~1070° C. and the V/III is adjusted to 1500~3000, growing the etching sacrificial layer films in the two-dimensional growth mode for 1000~5000 s. The etching sacrificial layer film will grow laterally in the two-dimensional growth mode. Growing in the two-dimensional growth mode for 1000~5000 s can make the etching sacrificial layer thin films grown on the nucleation islands laterally connect to form the etching sacrificial layer.

The V/III is the molar ratio of group V element and group III element, and the V/III can be realized by adjusting the flow rate of Mo source and ammonia gas.

In step S205, grow an etch stop layer on the etching sacrificial layer. The setting of the etch stop layer can prevent the etching liquid from contacting the epitaxial layer under the condition that the etching sacrificial layer is completely etched, so as to ensure the quality of the epitaxial layer.

The etch stop layer can be made of materials that are difficult to chemically react with the etching liquid. On the premise that the etching liquid is KOH etching liquid or NaOH etching liquid, the etch stop layer can be made of materials such as AlGaN and Mg-doped GaN and so on.

Exemplarily, the etching liquid may be KOH etching liquid or NaOH etching liquid.

It is difficult for the etching liquid to react with the TiO2 film, so that the hydrophilicity of the TiO2 film can guide the etching liquid well.

Optionally, the etching liquid may use an alkaline solution of an element of the same family as the potassium element, which is not limited in the present disclosure.

On the premise that the etching liqudi is KOH etching liquid, the nucleation island can be an AlN nucleation island, and the etching sacrificial layer can be a GaN layer.

When the nucleation islands are AlN nucleation islands and the etching sacrificial layer is a GaN layer, the side of the GaN layer grown on the AlN nucleation island close to the substrate will be grown to be a nitrogen polar surface with more nitrogen atoms, and the nitrogen polar surface can easily react with the KOH etching liquid, thereby improving the etching efficiency of the etching sacrificial layer.

Exemplarily, the etch stop layer may be doped with magnesium element, and the magnesium element is used to change the polarity of the side of the etch stop layer close to the substrate.

Magnesium can change the polarity of the side of the etch stop layer close to the substrate to the Ga polar side. It is difficult for the Ga polar surface to react with the KOH etching liquid, which can prevent the etch stop layer from being etched and protect the epitaxial layer on the etch stop layer.

It should be noted that the concentration of the magnesium element doped in the etch stop layer may be $1 \times 10^{20}$ cm$^{-3}$–$5 \times 10^{20}$ cm$^{-3}$.

Doping with high-concentration magnesium element can ensure that the polarity of the etching barrier layer facing the substrate changes from N polarity to Ga polarity, thereby reducing the etching rate of the etching liquid for the etch stop layer.

Optionally, the etch stop layer may be a GaN layer, an AlGaN layer or other structures, which are not limited in the present disclosure.

It should be noted that, after the etching sacrificial layer is separated from the substrate using an etching liquid, the etch stop layer can be removed by using plasma to bombard the etch stop layer.

In the present disclosure, the etching liquid can corrode the etching sacrificial layer uniformly, so the etch stop layer can be added on the epitaxial layer to protect the epitaxial layer. After the etching sacrificial layer is etched and separated by the etching liquid, the etching sacrificial layer remaining on the etch stop layer can be completely etched by the etching liquid, and the surface of the etch stop layer will be relatively flat. At this time, the parameters of the plasma bombardment equipment can be adjusted to remove the etch stop layer by plasma bombardment without damaging the epitaxial layer.

The step S205 is an optional step. The step S205 may be omitted in the case that the etching liquid corrodes the epitaxial layer to a small degree.

In step S206, grow an epitaxial layer on the etch stop layer.

The epitaxial layer is an epitaxial layer required for fabricating a semiconductor device, and the structure of the epitaxial layer is not limited in the embodiments of the present disclosure.

In step S207, fix a support substrate onto a surface of the epitaxial layer which is away from the substrate.

A support substrate is fixed on the surface of the epitaxial layer which is away from the substrate. The support substrate can be used as a support structure for the epitaxial layer, and the addition of the support substrate can ensure the stable peeling of the epitaxial layer.

Optionally, the support substrate and the epitaxial layer may be connected by means of eutectic or the like. This connection manner is easier to implement.

Step S207 is an additional step of the method shown in FIG. 2 compared to the method shown in FIG. 1, which can further ensure the quality of the epitaxial layer.

In step S208, irradiate the TiO2 film with ultraviolet light to obtain a hydrophilic layer.

The TiO2 film can be made hydrophilic by irradiating the TiO2 film with ultraviolet rays, thereby obtaining a hydrophilic layer. That is, the formation of the hydrophilic layer in the recess is achieved through steps 203 and 208.

Exemplarily, the aforementioned substrate is a transparent substrate, including but not limited to a glass substrate, a sapphire substrate, and the like. Optionally, the Step S208 includes: irradiate the TiO2 film with ultraviolet rays from the side of the substrate away from the epitaxial layer, to ensure that the TiO2 film is irradiated entirely and uniformly.

It should be noted that, in this embodiment, the TiO2 film is irradiated with ultraviolet rays after the epitaxial layer is grown. This is because that the hydrophilicity generated by using ultraviolet rays to irradiate the TiO2 film has a time limit. After a certain period of time, the hydrophilicity of the TiO2 film will disappear. In order to ensure that the TiO2 film is hydrophilic before the etching sacrificial layer and the substrate are immersed into the etching liquid, the TiO2 film is irradiated with ultraviolet rays after the epitaxial layer is grown in the embodiment of the present disclosure. If it can be ensured that steps S204 to S207 and steps S209 are all performed within the effective hydrophilic time period, the TiO2 film can be irradiated with ultraviolet rays in any steps between steps S203 to S209.

In step S209, the etching sacrificial layer and the substrate are soaked in the etching liquid until the epitaxial layer is separated from the substrate.

When implemented, the entire epitaxial wafer can be placed into an etching liquid to simplify workflow and improve efficiency. Alternatively, a part of the epitaxial wafer from the substrate to the etch stop layer can be placed into the etching liquid, as long as the etching liquid can enter into the flowing space to corrode the sacrificial layer and thereby realize the separation of the epitaxial layer and the substrate.

According to the embodiments of the present disclosure, a hydrophilic layer is formed in the recess of the first surface, and then an etching sacrificial layer is formed on the first surface to cover the first surface, and the etching sacrificial layer and the recess define a flowing space. When the etching sacrificial layer and the substrate are soaked in the etching liquid, the hydrophilic layer can guide the etching liquid to flow rapidly in the flowing space such that the etching liquid can corrode the etching sacrificial layer rapidly and uniformly until the epitaxial layer is separated from the first surface of the substrate.

Figure 3:
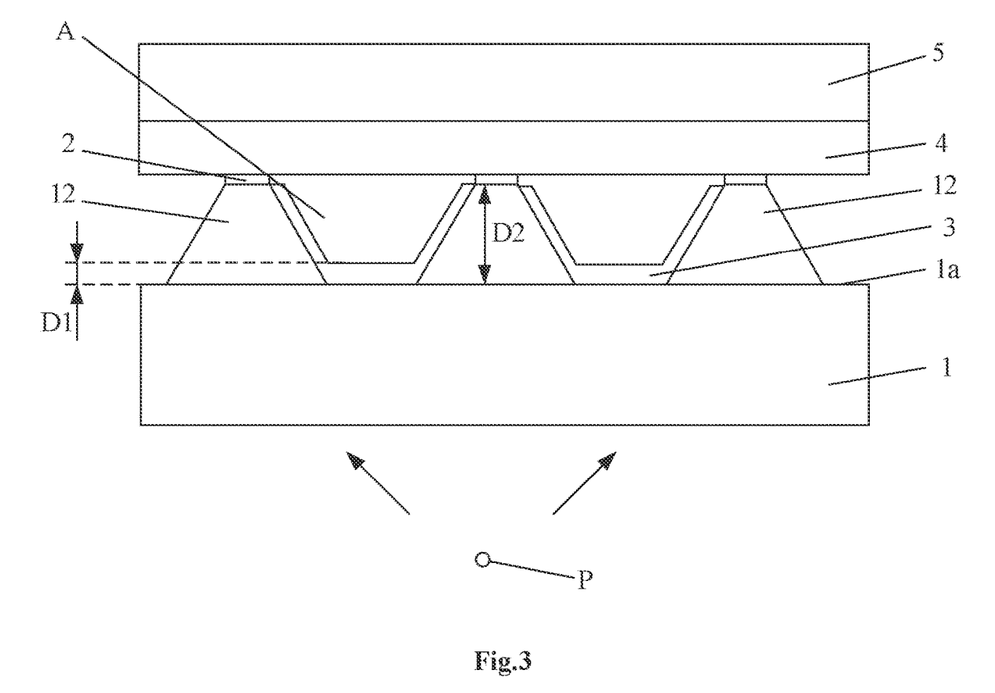
FIG. 3 is a schematic structural diagram of an epitaxial wafer provided by an embodiment of the present disclosure.

FIG. 3 is a schematic structural diagram of an epitaxial wafer provided by an embodiment of the present disclosure. The epitaxial wafer is fabricated using steps S101 to S104 of the method shown in FIG. 1.

As shown in FIG. 3, the epitaxial wafer includes a substrate 1, a hydrophilic layer 3, an etching sacrificial layer 4, and an epitaxial layer 5. The substrate 1 has a recess distributed on the first surface 1a of the substrate 1. The hydrophilic layer 3 is in the recess. The etched sacrificial layer 4 covers the first surface 1a, and the etched sacrificial layer 4 and the recess define a flowing space A. The epitaxial layer 5 is on the etching sacrificial layer 4.

Optionally, as shown in FIG. 3, the epitaxial wafer further includes a plurality of nucleation islands 2 which are located on the first surface 1a in areas other than the recess.

Exemplarily, the recess defines a plurality of bosses 12 which are equidistantly spaced, and the nucleation islands 2 are located on the end faces of the bosses 12.

Exemplarily, a $TiO_2$ film 3 is formed on the bottom surface and sidewall of the recess. The thickness D1 of the $TiO_2$ film 3 is smaller than the height D2 of the boss 12, that is, the depth of the recess. The etching sacrificial layer 4 is grown using the nucleation islands 2 on the bosses 12 as growth points. A flowing space A is formed between the etching sacrificial layer 4 and the $TiO_2$ film 3 in the recess. Optionally, the $TiO_2$ film may be doped with elements 14 for improving the hydrophilicity of the $TiO_2$ film, and the elements 14 for improving the hydrophilicity of the $TiO_2$ film include but are not limited to N, C or F elements.

Figure 4:
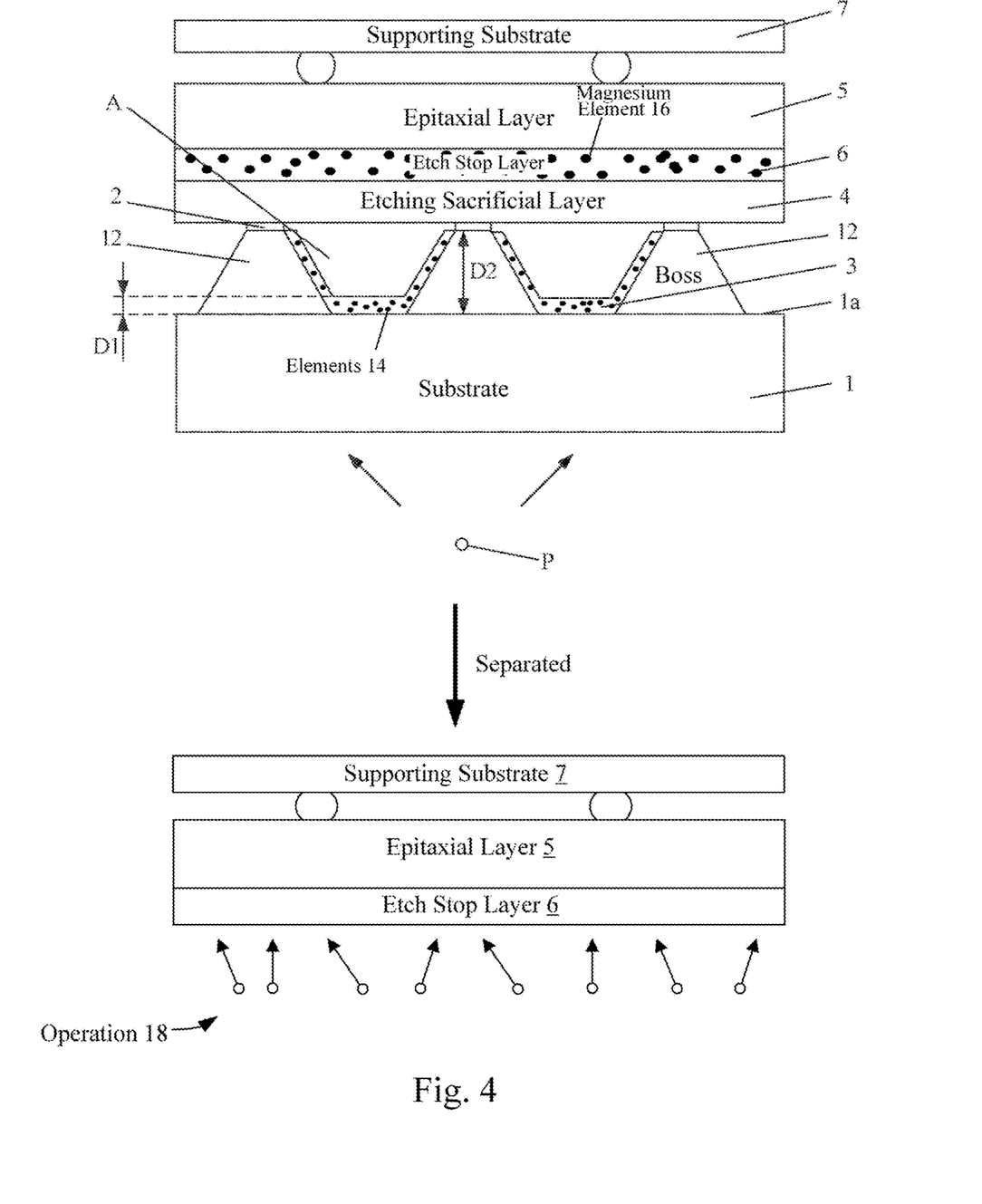
FIG. 4 is a schematic structural diagram of another epitaxial wafer provided by an embodiment of the present disclosure.

FIG. 4 is a schematic structural diagram of an epitaxial wafer according to an embodiment of the present disclosure. The epitaxial wafer can be fabricated by steps S201 to S208 of the method shown in FIG. 2.

As shown in FIG. 4, compared with the epitaxial wafer shown in FIG. 3, the epitaxial wafer further includes an etch stop layer 6. The etch stop layer 6 is between the etching sacrificial layer 4 and the epitaxial layer 5. In some embodiments, the etch stop layer 6 may be doped with magnesium element 16, and the magnesium element 16 is used to change the polarity of the side of the etch stop layer 6 close to the substrate 1. It should be noted that, after the etching sacrificial layer 4 is separated from the substrate 1 using an etching liquid, the etch stop layer 6 can be removed by using plasma to bombard (operation 18) the etch stop layer 6.

Optionally, the epitaxial wafer further includes a supporting substrate 7 for supporting which is located on the other side of the epitaxial layer 5 away from the substrate 1.

The above descriptions are only optional embodiments of the present disclosure, and are not intended to limit the present disclosure. Any modifications, equivalent replacements, improvements, etc. made within the spirit and principles of the present disclosure shall be included in the protection range of the present disclosure.

What is claimed is:

1. A substrate stripping method, comprising:
   providing a substrate, the substrate having a recess on a first surface of the substrate;
   forming a hydrophilic layer in the recess, the forming further comprising:
     forming a $TiO_2$ film in the recess; and
     irradiating the $TiO_2$ film with ultraviolet light to obtain the hydrophilic layer;
   forming, on the first surface, an etching sacrificial layer covering the first surface, the etching sacrificial layer and the recesses defining a flowing space;
   growing an epitaxial layer on the etching sacrificial layer; and
   soaking the etching sacrificial layer and the substrate in an etching liquid, and etching the etching sacrificial layer within the etching liquid until the epitaxial layer is separated from the substrate.

2. The method according to claim 1, wherein the substrate is transparent, irradiating the $TiO_2$ film with ultraviolet light further comprising:
   irradiating the $TiO_2$ film with ultraviolet light from a second surface of the substrate, wherein the second surface and the first surface are two opposite surfaces of the substrate.

3. The method according to claim 1, wherein the $TiO_2$ film is formed before growing the epitaxial layer, the method further comprising:
   performing irradiation of the $TiO_2$ film with ultraviolet light after growing the epitaxial layer.

4. The method according to claim 1, wherein the $TiO_2$ film is doped with N, C or F elements for improving hydrophilicity of the $TiO_2$ film.

5. The method according to claim 1, further comprising:
   fixing a support substrate onto a surface of the epitaxial layer which is away from the substrate before irradiating the $TiO_2$ film with ultraviolet light.

6. The method according to claim 1, wherein forming the etching sacrificial layer on the hydrophilic layer comprises:
   forming a plurality of nucleation islands in regions of the first surface other than the recess; and
   growing the etching sacrificial layer laterally with each of the nucleation islands as growth points.

7. The method according to claim 6, wherein the etching sacrificial layer is made of nitride material, and wherein growing the etching sacrificial layer laterally with each of the nucleation islands as growth points comprises:
   under a condition that a temperature is within a temperature range of 960-1010° C. and a V/III ratio is within a V/III ratio range of 800-1200, growing etching sacrificial layer thin films in a three-dimensional growth mode for 600-1500 s;
   under a condition that the temperature is within a temperature range of 1040-1070° C. and the V/III ratio is adjusted to a V/III ratio range of 1500-3000, growing the etching sacrificial layer thin films in a two-dimensional growth mode, in which the etching sacrificial layer thin films will grow laterally, until the etching sacrificial layer thin films grown on each of the nucleation islands are laterally connected to form the etching sacrificial layer.

8. The method according to claim 6, wherein the nucleation islands are AlN nucleation islands, and the etching sacrificial layer is a GaN layer.

9. The method according to claim 1, further comprising:
   growing an etch stop layer on the etching sacrificial layer before growing the epitaxial layer on the etching sacrificial layer.

10. The method according to claim 9, wherein the etch stop layer is doped with magnesium element to change a polarity of a side of the etch stop layer.

11. The method according to claim 1, wherein a thickness of the $TiO_2$ film is within a thickness range of 50-300 nanometers, and a depth of the recess is within a depth range of 2-5 micrometers.

12. The method according to claim 1, wherein the recess defines a plurality of bosses or a plurality of strip-shaped protrusions that are parallel to each other on the first surface.

13. The method according to claim 1, wherein the etching liquid is of KOH etching liquid or NaOH etching liquid.

14. A substrate stripping method, comprising:
   providing a substrate, the substrate having a recess on a first surface of the substrate;
   forming a hydrophilic layer in the recess;
   forming, on the first surface, an etching sacrificial layer covering the first surface, the etching sacrificial layer and the recesses;
   forming an etch stop layer on the etching sacrificial layer before growing an epitaxial layer on the etching sacrificial layer;
   growing the epitaxial layer on the etching sacrificial layer; and
   soaking the etching sacrificial layer and the substrate in an etching liquid, and etching the etching sacrificial layer until the epitaxial layer is separated from the substrate;
   bombarding the etch stop layer with plasma to remove the etch stop layer after the epitaxial layer is separated from the substrate.

15. The method according to claim 14, wherein forming the etching sacrificial layer on the hydrophilic layer comprises:
   forming a plurality of nucleation islands in regions of the first surface other than the recess; and
   growing the etching sacrificial layer laterally with each of the nucleation islands as growth points.

16. The method according to claim 15, wherein the nucleation islands are AlN nucleation islands, and the etching sacrificial layer is a GaN layer.

17. The method according to claim 14, wherein the recess defines a plurality of bosses or a plurality of strip-shaped protrusions that are parallel to each other on the first surface.

18. The method according to claim 14, wherein the etching liquid is KOH etching liquid or NaOH etching liquid.

19. The method according to claim 14, wherein forming the hydrophilic layer in the recess further comprises:
    forming a $TiO_2$ film in the recess; and
    irradiating the $TiO_2$ film with ultraviolet light to obtain the hydrophilic layer.

20. The method according to claim 14, wherein the etch stop layer is doped with magnesium element to change a polarity of a side of the etch stop layer.

* * * * *